(12) United States Patent
Zhang

(10) Patent No.: US 6,827,759 B2
(45) Date of Patent: Dec. 7, 2004

(54) METHOD FOR REDUCING THE OXYGEN AND OXIDE CONTENT IN COBALT TO PRODUCE COBALT SPUTTERING TARGETS

(75) Inventor: Hao Zhang, Vancouver, WA (US)

(73) Assignee: Tosoh SMD, Inc., Grove City, MD (US)

(*) Notice: Subject to any disclaimer, the term of this patent is extended or adjusted under 35 U.S.C. 154(b) by 155 days.

(21) Appl. No.: 10/343,286

(22) PCT Filed: Aug. 3, 2001

(86) PCT No.: PCT/US01/24396
§ 371 (c)(1),
(2), (4) Date: Jan. 29, 2003

(87) PCT Pub. No.: WO02/12577
PCT Pub. Date: Feb. 14, 2002

(65) Prior Publication Data
US 2004/0011442 A1 Jan. 22, 2004

(51) Int. Cl.[7] ............................. C22C 19/07; C22F 1/10
(52) U.S. Cl. .......................................... 75/674; 148/425
(58) Field of Search ................................. 148/425, 674

(56) References Cited

U.S. PATENT DOCUMENTS

| | | | |
|---|---|---|---|
| 5,810,983 A | 9/1998 | Shindo et al. | |
| 6,123,783 A | 9/2000 | Bartholomeusz et al. | |
| 6,129,900 A | 10/2000 | Satoh et al. | |
| 6,251,337 B1 | 6/2001 | Kane | |
| 6,391,172 B2 * | 5/2002 | Cole et al. | 204/298.13 |
| 2001/0001438 A1 | 5/2001 | Cole et al. | |

OTHER PUBLICATIONS

H. Zhang, J. Poole, R. Eller and M. Keef: "Cobalt Sputtering Target and Sputter Deposition of Co Thin Films for Cobalt Silicide Metallization" J. Vac. Sci. Technol. A17, 1999, pp. 1904–1910.

C.E. Wickersham, Jr., R. Bailey, A. Leybovich and L. Zhu: "Sputter Process Induced Molten Metal Defects in Aluminum Alloy Metallization" Proc. SEMICON China 2000 Technical Symposium, Mar. 15–16, 2000, SEMI, pp. C1–AC.

* cited by examiner

Primary Examiner—Melvyn Andrews
(74) Attorney, Agent, or Firm—Hessler & Vanderburg

(57) ABSTRACT

The present invention relates to producing cobalt having a low oxygen and a low oxide inclusion content for use as a sputter target thereby reducing the arcing and metal defects during sputtering commonly associated with high-oxygen cobalt sputter targets. Notably, the method for reducing the oxygen content and the oxide inclusion content in cobalt are separate processes which may be combined in successive order to procuce a low-oxygen cobalt sputter target having a low oxide inclusion content. The reduction in oxygen content preferably is performed prior to reducing the oxide inclusion content. Accordingly, the artisan will appreciate that one process can be performed without the other depending upon whether a reduction in oxygen or oxide inclusions is preferred in a desired cobalt sputter target.

20 Claims, 2 Drawing Sheets

METHOD FOR REDUCING THE OXYGEN AND OXIDE CONTENT IN COBALT TO PRODUCE COBALT SPUTTERING TARGETS

CROSS-REFERENCE TO RELATED APPLICATION

Priority filing benefit of (1) International PCT application PCT/US01/24396 filed Aug. 3, 2001, and published under PCT 21(2) in the English language; and (2) U.S. Provisional Application Ser. No. 60/222,795 filed Aug. 3, 2000 is hereby claimed.

FIELD OF THE INVENTION

The present invention relates to a method for reducing the oxygen content and oxide inclusion content in cobalt to produce a low-oxygen cobalt sputter target having a low oxide inclusion content, and to the sputter target assemblies made therefrom.

BACKGROUND OF THE INVENTION

Cathodic sputtering is widely used for depositing thin layers, or films, of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits to form the thin layer, or film, on the receiving surface of the substrate.

Specifically, with respect to cobalt (Co) sputter targets, sputter deposition of cobalt thin films is a crucial step in forming thin and uniform cobalt silicide films. A typical $CoSi_2$ salicide (a self-aligned silicide) process involves sputter deposition of Co thin films on silicon wafers, followed by rapid thermal processing (RTP) to form CoSi at intermediate temperatures, and sequentially to form $CoSi_2$ at elevated temperatures. Notably, cobalt silicides have low resistivity, excellent chemical stability, inertness to nitrogen and low formation temperature and are considered an alternative to $TiSi_2$ for use as a contact in ultra-large scale integration (ULSI).

Cobalt ingots, from which cobalt targets typically are made, contain a certain amount of oxide inclusions such as cobalt oxides, cobalt-titanium oxides, etc. These oxide inclusions, or metal defects, cause arcing during sputtering deposition and create metal particles on the substrate (i.e. silicon wafers) onto which the cobalt is sputtered thereby significantly reducing the yields of the cobalt metallization.

Today's cobalt sputter targets typically contain high oxygen content ranging from 170 to about 400 weight parts per million (wppm) oxygen. It is known that the higher the oxygen content in a cobalt sputter target, the greater the amount of oxide inclusions. Consequently, when such high oxygen containing Co targets are used during sputtering, more arcs are formed resulting in a greater number of metal defects deposited on the substrate.

Accordingly, there remains a need in the art for a method for reducing the oxygen content and the oxide inclusion content in cobalt to produce a low-oxygen cobalt sputter target having a low oxide inclusion content, and to the sputter target assemblies made therefrom.

SUMMARY OF THE INVENTION

The present invention provides a method to reduce the oxygen content and the oxide inclusion content in cobalt to produce a low-oxygen cobalt sputter target having a low oxide inclusion content, and to the sputter target assemblies produced therefrom.

Notably, the method for reducing the oxygen content and the oxide inclusion content in cobalt are separate processes which may be combined in successive order to produce a low-oxygen cobalt sputter target having a low oxide inclusion content. The reduction in oxygen content preferably is performed prior to reducing the oxide inclusion content. Accordingly, the artisan will appreciate that one process can be performed without the other depending upon whether a reduction in oxygen or oxide inclusions is preferred in a desired cobalt sputter target. Reducing the oxygen content and oxide inclusion content in cobalt to produce low-oxygen cobalt sputter targets having low oxide inclusion contents reduces the arcing and the metal defects found with conventional high-oxygen cobalt sputter targets during sputtering.

The method for reducing the oxygen content in cobalt to produce a low-oxygen cobalt sputter target includes the steps of providing cobalt (eg. electrolytic deposit cobalt melting stock). The cobalt stock can be either low (eg. 3N5) or high-purity cobalt (eg. 4N5, 5N5, and 6N). A degassing agent, preferably carbon, more preferably carbon graphite powder, is mixed with the cobalt wherein the carbon, preferably, is present in an amount of 50–150 wppm of the mixture. The mixture is heated and degassed. The heating occurs above the melting point of the cobalt, preferably about 50 to 400 degrees F. above the melting point, to form a melted cobalt mixture wherein the carbon and initial oxygen content react to produce a second lower oxygen content. Without the addition of the carbon, the oxygen content would increase.

Finally, the melted mixture is cooled to produce a solidified cobalt having the desired lower oxygen content. The low-oxygen content in the solidified cobalt is about 1–170 ppm, preferably about 1–100 wppm, more preferably 1–about 50 and most preferably about 1–30 wppm. The solidified cobalt now is suitable for shaping into a desired sputter target or is ready for oxide inclusion reduction.

The oxide inclusion reduction method involves reducing oxide inclusions at a certain oxygen level, preferably no greater than 1000 wppm, by using certain fabrication and heat treatment steps. These steps include first providing cobalt having an initial oxide inclusion content, an initial oxygen content, and defining a first thickness. The cobalt can be either low (eg. 3N5) or high-purity cobalt (eg. 4N5, 5N5, and 6N). Accordingly, the cobalt may comprise the solidified cobalt from the oxygen reduction method.

Next, the cobalt is heated at a temperature below its melting point, preferably at about 2000 degrees F. The cobalt then is hot pressed such that the pressure reduces the first thickness to form a hot pressed cobalt defining a second thickness. The hot pressed cobalt then is heated at a temperature below the melting point thereof, preferably at about 1800 degrees F. Finally, the cobalt is hot rolled such that the rolling further reduces the second thickness to form a hot rolled cobalt defining a third thickness.

At such temperatures and at the stress provided by the press and roller, the oxide inclusions are broken into extremely small particles. These particles then dissociate to cobalt and oxygen. Finally, the dissociated oxygen is dissolved by cobalt. Accordingly, the hot rolled cobalt contains a second oxide inclusion content lower than the initial oxide inclusion content. The rolled cobalt now is suitable for shaping into a desired sputter target.

Accordingly, one object of the invention is to provide a method for reducing the oxygen content and the oxide inclusion content in cobalt to produce low-oxygen cobalt sputter targets having low oxide inclusion contents.

Another object of the invention is to reduce the arcing and metal defects associated with high-oxygen cobalt sputter targets during sputtering.

Lastly another object of the invention is to produce a sputter target assembly having a low-oxygen cobalt sputter target with a low oxide inclusion content.

The invention will be further described in the following description, the accompanying drawings and the appended claims.

DETAILED DESCRIPTION OF THE PREFERRED EMBODIMENT

The present invention relates to producing cobalt having a lowoxygen and a low oxide inclusion content for use as a sputter target thereby reducing the arcing and metal defects during sputtering commonly associated with high-oxygen cobalt sputter targets.

Notably, the method for reducing the oxygen content and the oxide inclusion content in cobalt are separate processes which may be combined in successive order to produce a low-oxygen cobalt sputter target having a low oxide inclusion content. The reduction in oxygen content method preferably is performed prior to reducing the oxide inclusion content. Accordingly, the artisan will appreciate that one process may be performed without the other depending upon whether a reduction in oxygen or oxide inclusions is preferred.

Figure 1:
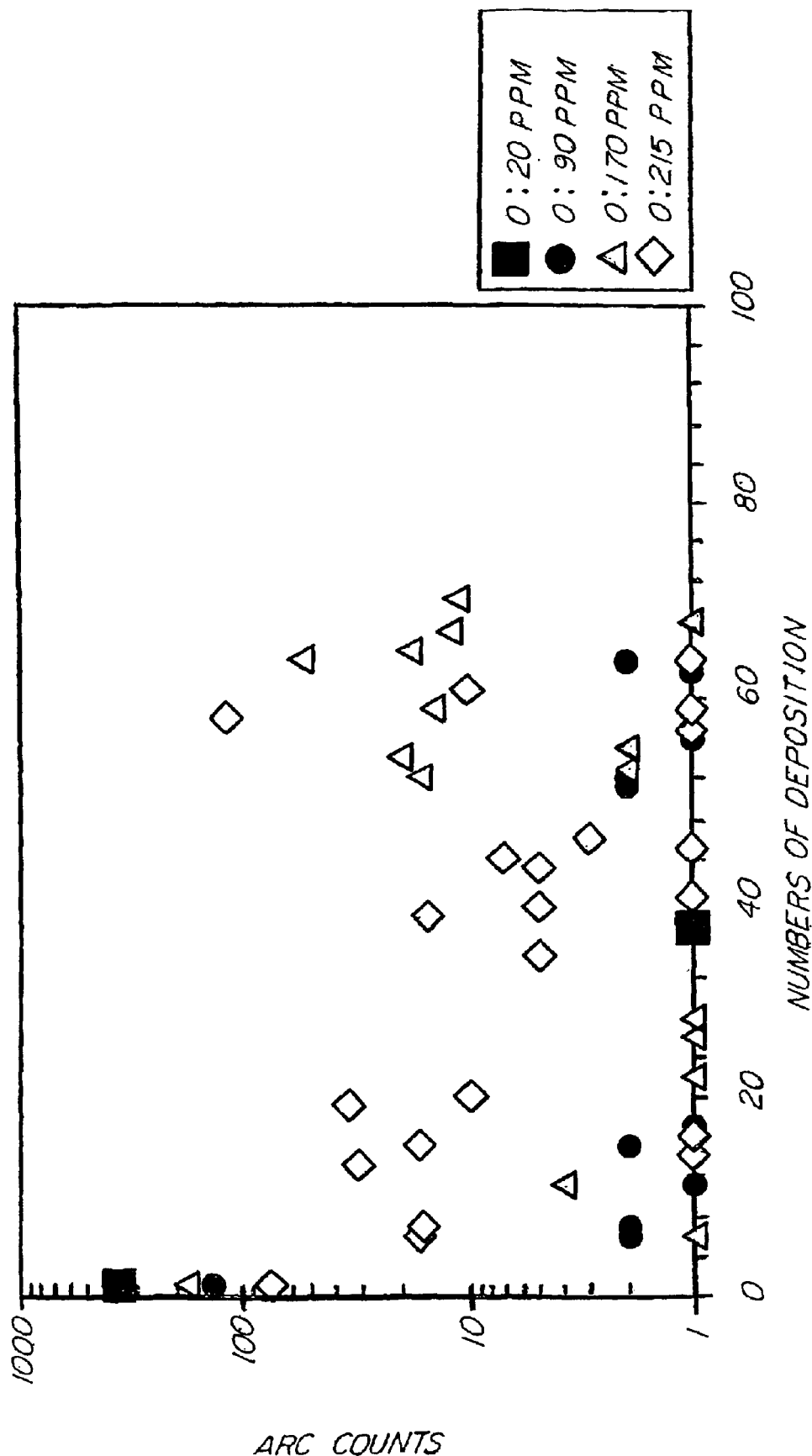
FIG. 1 is a graph showing arc counts during cobalt sputtering as a function of oxygen content in cobalt targets.

Today's cobalt sputter targets typically contain high-oxygen contents ranging anywhere from 170 to 400 weight parts per million (wppm) oxygen. A graph in FIG. 1 shows the effect of oxygen content in cobalt targets on arc counts during sputtering. The graph indicates that the arcing occurrence substantially decreases as oxygen content decreases. A considerable decrease in arc counts is observed when cobalt targets having oxygen contents of about 20 wppm and 90 wppm are used.

The method for reducing the oxygen content in cobalt to produce a low-oxygen cobalt sputter target includes the first step of providing cobalt (eg. electrolytic deposit cobalt melting stock). The cobalt stock can be either low (eg. 3N5) or high-purity cobalt (eg. 4N5, 5N5, and 6N). Low-purity cobalt stock can be purchased from Falcon Bridge, a Norwegian company, and the high-purity stock can be purchased from Japan Metals Chemicals (JMC) located in Japan.

A degassing agent, preferably carbon, more preferably carbon powder, is mixed with the cobalt. A high-purity carbon powder is most preferred to avoid contamination by impurities. One such type of high-purity carbon powder is HP 6N graphite powder which can be purchased from Alfa located in the USA. The mixing can be performed in a crucible, preferably made of zirconium oxide, wherein the carbon is present in a preferred amount of 50–150 wppm of the mixture, more preferably 50–100 wppm.

The mixture is placed into a furnace and heated and degassed. The degassing is performed via vacuum with the vacuum having a pressure of about $5\times10^{-5}$ to $1\times10^{-4}$ Torr. The heating occurs above the melting point of the cobalt, preferably about 50 to 400 degrees F. above the melting point, for about ½ hour to form a melted cobalt mixture wherein the carbon and initial oxygen content react to produce a second lower oxygen-content. The oxygen-in the molten cobalt reacts with the carbon particles to form $CO_2$ and CO gasses, which then become gas bubbles and eventually release from the molten cobalt into the vacuum chamber. Adding carbon significantly decreases the oxygen content. Accordingly, the resultant oxygen and carbon contents strongly depend on how much carbon is used. Without the addition of the carbon, the oxygen content would increase considerably.

The temperature in the furnace is reduced to about 50 degrees F. above the melting point of the cobalt after the initial ½ hour. Then the melted cobalt mixture is poured into a mold while still under vacuum. The temperature of the mold is held below the melting point of the cobalt so that the cobalt can solidify. The melted mixture then cools in the mold for about 2 hours to produce a solidified cobalt having the lower oxygen content.

Figure 2:
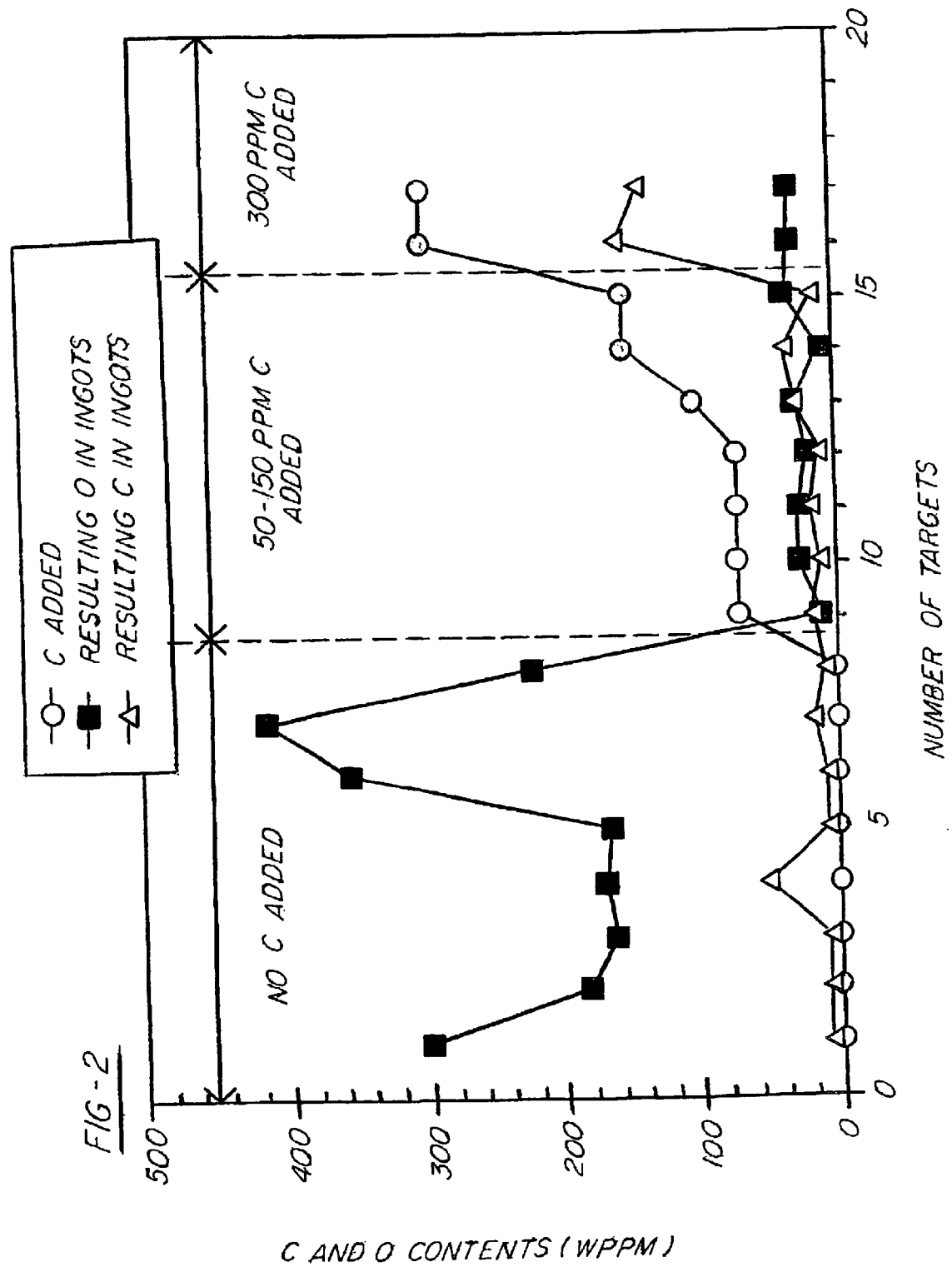
FIG. 2 is a graph showing the resultant oxygen and carbon contents in cobalt ingots as a function of added carbon powder.

FIG. 2 shows the resultant oxygen and carbon contents as a function of added carbon. The oxygen content varies from 170 to 410 wppm when there is no degassing agent (i.e. carbon) added. With 50 to 150 wppm of carbon, the resultant oxygen content in the cobalt ranges from 5 to 30 wppm, and the resultant carbon content in the cobalt ranges from less than 10 to 25 wpm. As the amount of added carbon is >150 wppm, there is too much remaining carbon in the cobalt material. The high level of remaining carbon also can cause problems during sputtering. Therefore, the optimum carbon addition is from 50 to 150 wppm. The solidified cobalt now is suitable for shaping into a desired sputter target or is ready for oxide inclusion reduction.

Next, with respect to the oxide inclusion reduction method, this method involves reducing oxide inclusions at a certain oxygen level, preferably no greater than 1000 wppm, by using certain fabrication and heat treatment steps. These steps include providing cobalt having an initial oxide inclusion content, an initial oxygen content, and defining a first thickness. The cobalt can be either low (eg. 3N5) or high-purity cobalt (eg. 4N5, 5N5, and 6N) and may comprise the solidified cobalt produced from the above oxygen reduction method. The oxide inclusion content typically is measured using optical metallography and scanning electron microscope/energy dispersion spectrum (SEM/EDS).

Next, the cobalt is heated at a temperature below its melting point, preferably at about 2000 degrees F. for about 2 hours. The cobalt then is hot pressed such that-the pressure reduces the first thickness, preferably by about 50%, in about 1 minute to form a hot pressed cobalt defining a second thickness. The hot pressed cobalt then is heated at a temperature below the melting point thereof, preferably at about 1800 degrees F. for about 1 hour.

Finally, the cobalt is hot rolled in a roller at room temperature such that the rolling further reduces the second thickness, preferably by about 60–70%, to form a hot rolled cobalt defining a third thickness. Accordingly, at such temperatures and at the stress provided by the press and roller, the oxide inclusions are broken into extremely small particles. These particles then dissociate to cobalt and oxygen. Finally, the dissociated oxygen is dissolved by cobalt. Accordingly, the hot rolled cobalt contains a second oxide inclusion content lower than the initial oxide inclusion content. Notably, after fabrication, the oxide inclusions significantly decrease, if not disappear altogether. The rolled cobalt now is suitable for shaping into a desired sputter target.

As noted, the low-oxygen and low oxide inclusion cobalt produced by the above processes are used as cobalt sputter targets to reduce the arcing and metal defects during sputtering deposition commonly associated with high-oxygen cobalt targets. These low-oxygen targets having low oxide inclusions are best used with metallic backing plates comprising copper, aluminum, and alloys thereof.

The invention thereby is capable of producing sputtering targets comprising Co having less than about 170 wppm of oxygen therein. Preferably, the targets include less than 100 wppm oxygen with amounts of less than 50 wppm oxygen being most preferred. (All ppm calculations are based upon the total weight of the target).

The cobalt/degassing agent admixture that is used in the disclosed process to form lowered oxide inclusion amounts is a Co/C admixture wherein c is present in an amount of about 1–150 wppm based on the weight of the admixture, preferably in an amount of about 50–150 wppm and most preferably about 50–100 wppm.

While the methods described herein and the cobalt produced in accordance with the method constitute preferred embodiments of the invention, it is to be understood that the invention is not limited to these precise methods and structures, and that changes may be made in either without departing from the scope of the invention, which is defined in the appended claims.

What is claimed is:

1. A method for reducing the oxygen content in cobalt to produce a low oxygen content cobalt sputter target for decreasing arcing during sputtering deposition comprising:
    (a) providing a mixture of cobalt and a degassifying agent, said cobalt having an initial oxygen content; and
    (b) heating and degassing said mixture such that said degassifying agent and said initial oxygen content react producing a second oxygen content less than the initial oxygen content.

2. A method as recited in claim 1 wherein said second oxygen content is within the range of about 1–170 wppm.

3. A method for reducing the oxygen content in cobalt to produce a low-oxygen cobalt sputter target for decreasing arcing during sputtering deposition comprising:
    (a) providing a mixture of cobalt and carbon, said cobalt having an initial oxygen content and said carbon present in an amount of 1–150 wppm of said mixture;
    (b) heating and degassing said mixture, said mixture being heated above the melting point of said cobalt to form a melted cobalt mixture such that said carbon and said initial oxygen content react to produce a second oxygen content lower than said initial oxygen content; and
    (c) cooling said melted cobalt mixture to produce a solidified cobalt having said second oxygen content, said solidified cobalt suitable for shaping into said sputter target.

4. The method for reducing the oxygen content in cobalt as recited in claim 3 wherein said cobalt is selected from the group consisting of 3N5, 4N5, 5N5, and 6N cobalt.

5. The method for reducing the oxygen content in cobalt as recited in claim 3 wherein said carbon is carbon powder.

6. The method for reducing the oxygen content in cobalt as recited in claim 3 wherein said carbon is provided in an amount of about 50–150 wppm of said mix.

7. The method for reducing the oxygen content in cobalt as recited in claim 5 wherein said carbon is provided in an amount of about 50–100 wppm of said mix.

8. The method for reducing the oxygen content in cobalt as recited in claim 1 wherein said mixture is heated at about 50° F. to 400° F. above the melting point of said cobalt for about ½ hour and wherein said degassing is performed via vacuum, said vacuum having a pressure of about $5 \times 10^{-5}$ to $1 \times 10 = hu -4$ Torr.

9. A method for reducing the oxide inclusion content in cobalt to produce a cobalt sputter target having a low oxide content to decrease metal defects caused during sputtering deformation comprising:
    (a) providing cobalt, said cobalt having an initial oxide inclusion content, an initial oxygen content and a first thickness;
    (b) heating said cobalt at a temperature below its melting point;
    (c) compressing said heating cobalt to reduce said first thickness to a second thickness;
    (d) heating said cobalt resulting from (c) at a temperature below said melting point; and
    (e) further compressing said cobalt resulting from (d) such that a third thickness of said cobalt is obtained having a second oxide inclusion content lower than said initial oxide inclusion content.

10. The method for reducing the oxide inclusion content in cobalt as recited in claim 9 wherein said cobalt is selected from the group consisting of 3N5, 4N5, 5N5, and 6N cobalt.

11. The method for reducing the oxide inclusions in cobalt as recited in claim 9 wherein in step (c) said first thickness of said heated cobalt is reduced by about 50%.

12. The method for reducing the oxide inclusions in cobalt as recited in claim 9 wherein in step (e) said second thickness of said heated hot pressed cobalt is reduced by about 60–70% to yield the third thickness.

13. A method of making a low-oxygen cobalt sputter target having a low-oxide inclusion content comprising:
    (a) providing a mixture of cobalt and carbon, said cobalt having an initial oxygen content and said carbon being present in an amount of 1–150 wppm of said mixture;
    (b) heating and degassing said mixture, said mixture being heated above the melting point of said cobalt to form a melted cobalt mixture such that said carbon and said initial oxygen content react to produce a second oxygen content lower than said initial oxygen content;
    (c) cooling said melted cobalt mixture to produce a solidified cobalt having said second oxygen content, said solidified cobalt further having an initial oxide inclusion content and defining a first thickness;
    (d) heating said solidified cobalt at a temperature below the melting point of said cobalt;
    (e) hot pressing said heated cobalt such that said pressure reduces said first thickness thereby forming a hot pressed cobalt defining a second thickness;
    (f) heating said hot pressed cobalt at a temperature below the melting point of said cobalt; and
    (g) hot rolling said heated hot pressed cobalt such that said rolling further reduces said second thickness thereby forming a hot rolled cobalt defining a third thickness, said hot rolled cobalt further having a second oxide inclusion content lower than said initial oxide inclusion content and being suitable for shaping into said cobalt sputter target.

14. A method of making a low-oxygen cobalt sputter target as recited in claim 13 wherein said cobalt is selected from the group consisting of 3N5, 4N5, 5N5, and 6N cobalt.

15. A method of making a low-oxygen cobalt sputter target as recited in claim 13 wherein said carbon is carbon powder.

16. A method of making a low-oxygen cobalt sputter target as recited in claim 13 wherein said carbon is provided in an amount of 50–100 wppm of said mix.

17. A method of making a low-oxygen cobalt sputter target as recited in claim 13 wherein said mixture is heated at about 50° F. to 400° F. above the melting point of said cobalt for about ½ hour and wherein said degassing is performed via vacuum, said vacuum having a pressure of about $5 \times 10^{-5}$ to $1 \times 10^{-4}$ Torr.

18. A method of making a low-oxygen cobalt sputter target as recited in claim 13 wherein in step (e) said first thickness of said heated cobalt is reduced by about 50%.

19. A method of making a low-oxygen cobalt sputter target as recited in claim 13 wherein in step (f) said hot pressed cobalt is heated at about 1800° F. for about 1 hour.

20. A method of making a low-oxygen cobalt sputter target as recited in claim 13 wherein in step (g) said second thickness of said heated hot pressed cobalt is reduced by about 60–70% to yield the third thickness.

* * * * *